United States Patent

Dehm et al.

[11] Patent Number: 5,804,499
[45] Date of Patent: Sep. 8, 1998

[54] PREVENTION OF ABNORMAL $WSI_x$ OXIDATION BY IN-SITU AMORPHOUS SILICON DEPOSITION

[75] Inventors: Christine Dehm, Wappingers Falls, N.Y.; Reinhard J. Stengl, Stadtbergen; Hans-Joerg Timme, Ottobrunn, both of Germany

[73] Assignee: Siemens Aktiengesellschaft, Munich, Germany

[21] Appl. No.: 642,294

[22] Filed: May 3, 1996

[51] Int. Cl.$^6$ .................................................. H01L 21/285
[52] U.S. Cl. ........................... 438/592; 438/596; 438/683
[58] Field of Search ..................... 438/303, 304, 438/592, 595, 596, 655, 683, 649, 360

[56] References Cited

U.S. PATENT DOCUMENTS

| | | | |
|---|---|---|---|
| 2,836,935 | 6/1958 | Stanworth et al. | 49/81 |
| 3,765,953 | 10/1973 | Chevillon et al. | 148/6.3 |
| 4,128,670 | 12/1978 | Gaenssien . | |
| 4,972,250 | 11/1990 | Omori et al. | 357/54 |
| 5,183,770 | 2/1993 | Ayukawa et al. | 438/595 |
| 5,326,989 | 7/1994 | Muragishi | 257/67 |
| 5,350,698 | 9/1994 | Huang et al. | 437/41 |
| 5,441,914 | 8/1995 | Taft et al. | 437/189 |

FOREIGN PATENT DOCUMENTS

| | | |
|---|---|---|
| 58-155767 | 9/1983 | Japan . |
| 63-76479 | 4/1988 | Japan . |
| 3-9530 | 1/1991 | Japan . |
| 3-46237 | 2/1991 | Japan . |
| 5-267335 | 10/1993 | Japan . |
| 6-267973 | 9/1994 | Japan . |
| 7-161976 | 6/1995 | Japan . |
| 8-97414 | 4/1996 | Japan . |

OTHER PUBLICATIONS

S. Wolf & R.N. Tauber, "Silicon Processing for the VLSI Era" vol. 1, p. 520, 1986.

*Primary Examiner*—Charles L. Bowers, Jr.
*Assistant Examiner*—Leon Radomsky
*Attorney, Agent, or Firm*—Donald B. Paschburg

[57] ABSTRACT

A process which prevents abnormal $WSi_x$ oxidation during subsequent LPCVD insulator deposition and gate sidewall oxidation, uses an in-situ deposition of a thin amorphous silicon layer on top of the tungsten silicide as well as the deposition of an amorphous spacer after gate stack patterning, respectively.

5 Claims, 2 Drawing Sheets

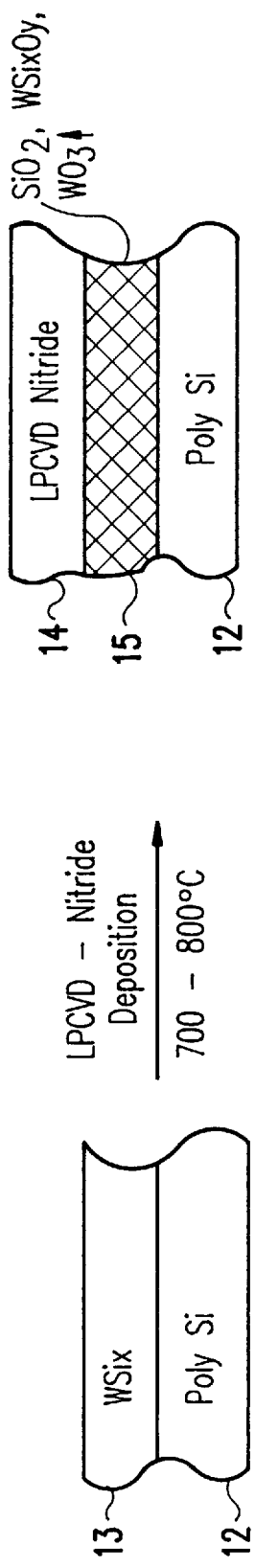
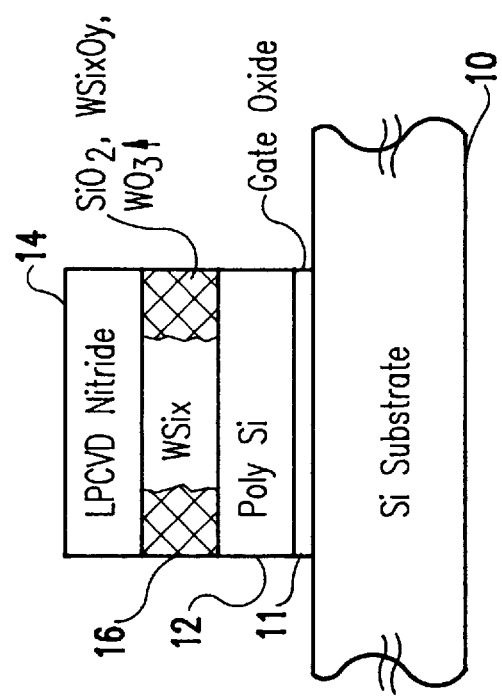
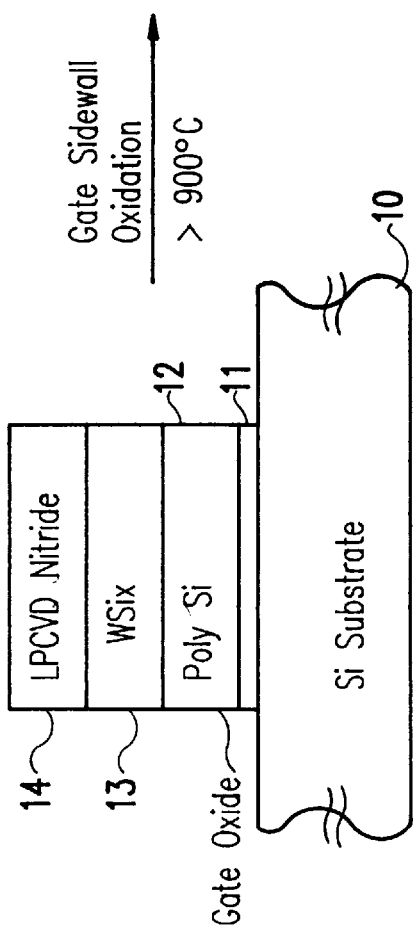
FIG. 2 PRIOR ART
FIG. 3 PRIOR ART

PREVENTION OF ABNORMAL WSi$_x$ OXIDATION BY IN-SITU AMORPHOUS SILICON DEPOSITION

BACKGROUND OF THE INVENTION

1. Field of the invention

The present invention generally relates to the fabrication of microelectronic devices in very large scale integrated (VLSI) circuits and, more particularly, to the deposition of tungsten silicide films of the type typically used for gate level interconnects.

2. Background Description

Chemical vapor deposited (CVD) tungsten silicide (WSi$_x$) films of typically 50 nanometers (nm) to 100 nm thickness are used on doped, polycrystalline silicon (polysilicon) for-gate level interconnects in deep submicron memory devices because of properties such as low resistivity, low contamination levels, and good step coverage. WSi$_x$ layers deposited by dichlorosilane (DCS), i.e., SiH$_2$Cl$_2$/WF$_6$ chemistry are considered to be superior to WSi$_x$ layers deposited by silane (SiH$_4$/WF$_6$) process because of lower fluorine content ($\leq 10^{18}$ at/cm$^3$), improved step coverage, lower post-annealed stress, and better adhesion. See, for example, M. Y. Tsai et al., *J. Electrochem. Soc.*, 128, 10 (1981) and S. G. Telford et al., *J. Electrochem. Soc.*, 140, 12 (1993). DCS WSi$_x$ films can, however, exhibit in-depth compositional non-uniformities which are critical for ultra large scale integration on 200 mm wafers, as reported by S. G. Telford et al. Especially when grown on doped polysilicon, a W-rich nucleation layer can be formed at the polysilicon/silicide interface. A W-rich interface can cause excessive interdiffusion of silicon at temperatures $\geq 700°$ C., localized stress and adhesion problems. See again S. G. Telford et al., supra. Exposure of W-rich suicides to oxidizing ambient at temperatures below 900° C. usually results in the formation of SiO$_2$, WO$_3$, and other volatile tungsten oxides, known as abnormal WSi$_x$ oxidation. See again M. Y. Tsai et al., supra, and M. P. Siegal and J. J. Santiago, *J. Appl. Phys.*, 65, 2 (1989). WSi$_x$ deposition is normally followed by insulator deposition for gate stack isolation. In case the subsequent process is a low pressure CVD (LPCVD) nitride deposition normally performed at temperatures between 700° C. and 800° C., as described by S. M. Sze, *VLSI Technology*, McGraw-Hill, 1984, at page 121, the abnormal oxidation can occur during the ramp up due to residual oxygen in the furnace. The undesired WSi$_x$ oxidation is also likely to happen after gate stack patterning during gate sidewall oxidation which is a common process used for gate isolation.

SUMMARY OF THE INVENTION

It is therefore an object of the present invention to provide a process for the deposition of tungsten silicide films which prevents abnormal WSi$_x$ oxidation.

To avoid abnormal oxidation of stoichiometrical non-uniform DCS WSi$_x$ during subsequent LPCVD insulator deposition and gate sidewall oxidation, an in-situ deposition of a thin amorphous silicon layer on top of the tungsten silicide as well as the deposition of an amorphous silicon spacer after gate stack patterning, respectively, is used.

BRIEF DESCRIPTION OF THE DRAWINGS

The foregoing and other objects, aspects and advantages will be better understood from the following detailed description of a preferred embodiment of the invention with reference to the drawings, in which:

FIG. 2 is a cross-sectional view illustrating abnormal WSi$_x$ oxidation during LPCVD nitride deposition;

FIG. 3 is a cross-sectional view illustrating abnormal WSi$_x$ oxidation during gate sidewall oxidation;

DETAILED DESCRIPTION OF PREFERRED EMBODIMENTS OF THE INVENTION

Figure 1:
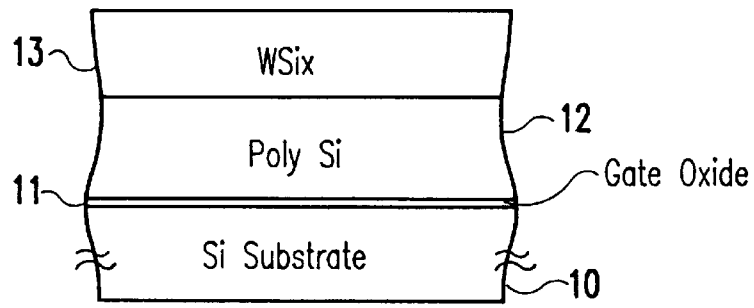
FIG. 1 is a cross-sectional view of a typical Wsi$_x$/polysilicon gate interconnect structure.

Referring now to the drawings, and more particularly to FIG. 1, there is shown a typical WSi$_x$/polysilicon gate interconnect structure comprising a gate oxide 11 formed on a silicon substrate 10. A doped polysilicon layer 12 is deposited over the gate oxide 11, and a WSi$_x$ film 13 is deposited by CVD to a thickness of typically 50 nm to 100 nm. CVD WSi$_x$ is used, for example, for gate level interconnects in deep submicron memory devices because of properties such as low resistivity, low contamination levels, and good step coverage. The WSi$_x$ layer 13 is deposited by dichlorosilane DCS chemistry which is considered to be superior to WSi$_x$ layers deposited by silane process because of lower fluorine content, improved step coverage, lower post-annealed stress, and better adhesion.

DCS WSi$_x$ films can exhibit in-depth compositional non-uniformities which are critical for ultra large scale integration on 200 mm wafers. Especially when grown on doped polysilicon, a W-rich nucleation layer can be formed at the polysilicon/silicide interface which can cause excessive interdiffusion of silicon at temperatures $\geq 700°$ C., localized stress and adhesion problems. Exposure of W-rich silicides to oxidizing ambient at temperatures below 900° C. usually results in the formation of SiO$_2$, WO$_3$, and other volatile tungsten oxides, known as abnormal WSi$_x$ oxidation. WSi$_x$ deposition is normally followed by insulator deposition for gate stack isolation. In case the subsequent process is a LPCVD nitride deposition to form a nitride layer 14 normally performed at temperatures between 700° C. and 800° C., the abnormal oxidation can occur during the ramp up due to residual oxygen in the furnace, as shown in FIG. 2, to produce the abnormal oxidation generally shown at 15. The undesired WSi$_x$ oxidation is also likely to happen after gate stack patterning during gate sidewall oxidation which is a common process used for gate isolation, as shown in FIG. 3. Here, the abnormal oxide 16 is formed on the exposed WSi$_x$ areas at the side of the gate stack.

Figure 4:
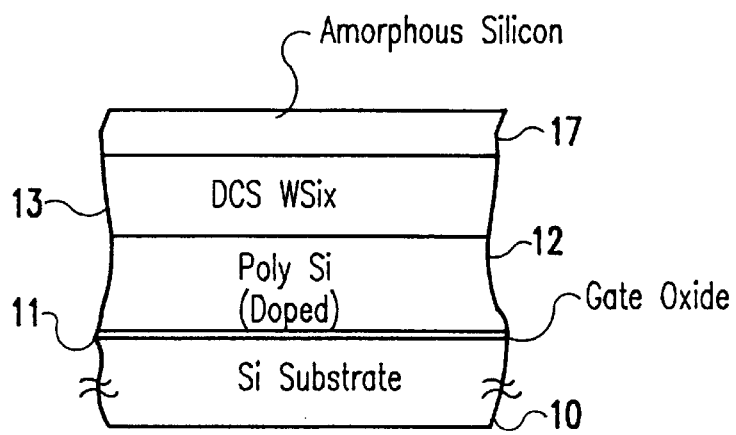
FIG. 4 is a cross-sectional view showing the amorphous silicon/doped polysilicon/DCS WSi$_x$ gate interconnect structure according to the present invention.

A schematic cross-section of the gate polycide (polysilicon/silicide) structure according to the invention is shown in FIG. 4. To prevent oxidation of DCS WSi$_x$ during subsequent processes at temperatures $\geq 700°$ C., the tungsten silicide surface 13 is protected by in-situ CVD deposition of a thin amorphous Si layer 17 with minimal thickness of 20 nm to guarantee void-free processing. The process sequence is specially designed for CVD cluster tools with a base pressure of about $10^{-7}$ to $10^{-8}$ torr allowing the formation of an integrated doped polysilicon/WSi$_x$/amorphous silicon gate structure without breaking vacuum. After deposition of the integrated interconnect gate stack, the formation of a native oxide in atmospheric pressure is desired to avoid disintegration of the amorphous Si layer during following high temperature steps.

By providing excess Si on top of the compositional non-uniform $WSi_x$, layer 13, not only surface oxidation is prevented, but also crystallization of a stoichiometrical homogenous, Si-rich DCS $WSi_x$ film is ensured. The in-situ deposition of the doped polysilicon/$WSi_x$/amorphous silicon has the advantage of reduced cycle time by avoiding additional cleaning steps otherwise necessary for native oxide removal before $WSi_x$ and amorphous silicon deposition, respectively.

Figure 5:
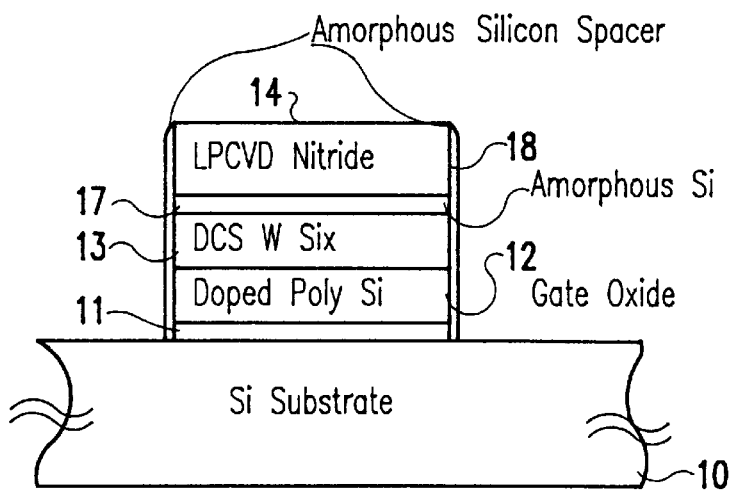
FIG. 5 is a cross-sectional view showing the amorphous silicon spacer formed by CVD deposition and reactive ion etching (RIE) subsequent to gate stack patterning according to the present invention.

As shown in FIG. 5, abnormal oxidation during gate sidewall oxidation is avoided by CVD deposition of a thin ($\geq 20$ nm) amorphous silicon spacer 18 subsequent to gate stack patterning. After deposition, the amorphous silicon spacer 18 needs to be etched back by reactive ion etching (RIE) so that no silicon is left on top of the gate stack. Using the amorphous silicon spacer ensures that no $WSi_x$ is exposed to oxygen during gate sidewall oxidation which could otherwise result in abnormal $WSi_x$ oxidation.

While the invention has been described in terms of preferred embodiments, those skilled in the art will recognize that the invention can be practiced with modification within the spirit and scope of the appended claims.

We claim:

1. A process which prevents abnormal $WSi_x$ oxidation and provides Si by homogenous $WSi_x$ formation in the manufacturing of integrated circuit devices comprising the steps of:

forming in a vacuum DCS $WSi_x$/doped polysilicon interconnect structures for the integrated circuit devices;

without breaking said vacuum, depositing an amorphous silicon layer on the interconnect structures; and, forming a native oxide on said deposited amorphous silicon layer.

2. The process according to claim 1 further comprising the step of depositing an insulating material at temperatures between 700° and 900° C. over the native oxide/amorphous silicon layer.

3. The process according to claim 2 wherein the insulating material is a LPCVD nitride.

4. The process according claim 1 further comprising the step of depositing a LPCVD nitride over the amorphous silicon layer.

5. A process which prevents abnormal $WSi_x$ oxidation and provides Si by homogenous $WSi_x$ formation in the manufacturing of integrated circuit devices comprising the step of:

growing agate oxide;

depositing on said gate oxide DCS $WSi_x$/doped polysilicon interconnect structures for the integrated circuit devices, wherein said interconnect structure serves as a gate for an electronic device;

depositing an amorphous silicon layer on the interconnect structures; and depositing by CVD deposition an amorphous silicon spacer on gate sidewalls after gate stack patterning to avoid abnormal DCS $WSi_x$ oxidation during gate sidewalls oxidation.

* * * * *